(12) United States Patent
Heurtier et al.

(10) Patent No.: US 7,636,006 B2
(45) Date of Patent: Dec. 22, 2009

(54) VOLTAGE SUPPLY INTERFACE CIRCUIT

(75) Inventors: Jerome Heurtier, Tours (FR); Samuel Menard, Tours (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 11/518,855

(22) Filed: Sep. 11, 2006

(65) Prior Publication Data

US 2007/0176667 A1 Aug. 2, 2007

Related U.S. Application Data

(63) Continuation of application No. 10/744,411, filed on Dec. 23, 2003, now abandoned.

(30) Foreign Application Priority Data

Dec. 27, 2002 (FR) .................................. 02 16808

(51) Int. Cl.
*H03L 5/00* (2006.01)
*H03K 17/687* (2006.01)

(52) U.S. Cl. ........................ 327/333; 327/433; 327/436; 326/62

(58) Field of Classification Search ........................ None
See application file for complete search history.

(56) References Cited

U.S. PATENT DOCUMENTS

| 4,403,395 | A |   | 9/1983 | Curran |
| 4,751,410 | A |   | 6/1988 | Tanizawa |
| 4,859,878 | A |   | 8/1989 | Murayama |
| 4,948,994 | A | * | 8/1990 | Akioka et al. ................ 327/432 |
| 4,996,449 | A |   | 2/1991 | Ueno |
| 5,382,916 | A |   | 1/1995 | King et al. |
| 5,450,267 | A | * | 9/1995 | Diaz et al. ..................... 361/56 |
| 5,504,451 | A |   | 4/1996 | Smayling et al. |
| 5,652,540 | A | * | 7/1997 | Eilley .......................... 327/565 |
| 5,712,588 | A | * | 1/1998 | Choi et al. .................... 327/525 |
| 6,222,414 | B1 | * | 4/2001 | Cini et al. ..................... 327/432 |
| 6,400,540 | B1 | * | 6/2002 | Chang .......................... 361/56 |
| 6,873,202 | B1 | * | 3/2005 | Lin .............................. 327/432 |
| 2003/0107429 | A1 |   | 6/2003 | Kawano |

OTHER PUBLICATIONS

French Search Report from French Patent Application 02/16808, filed Dec. 27, 2002.

* cited by examiner

*Primary Examiner*—Tuan Lam
(74) *Attorney, Agent, or Firm*—Lisa K. Jorgenson; James H. Morris; Wolf, Greenfield & Sacks, P.C.

(57) ABSTRACT

A monolithic interface circuit for providing a voltage, from a control circuit supplied by a supply voltage referenced to a reference voltage, to a terminal likely to be at a high voltage with respect to the reference voltage, comprising a high-voltage N-channel MOS transistor having its gate intended to receive a control signal referenced to the reference voltage and having its source intended to be connected to the reference voltage, and a high-voltage PNP transistor having its base connected to the drain of the MOS transistor, having its emitter intended to receive the supply voltage and having its collector intended to provide a voltage to the terminal likely to be at a high voltage.

11 Claims, 3 Drawing Sheets

VOLTAGE SUPPLY INTERFACE CIRCUIT

CROSS REFERENCES TO RELATED APPLICATION

This application is a continuation of application Ser. No. 10/744,411, filed Dec. 23, 2003, entitled VOLTAGE SUPPLY INTERFACE CIRCUITS, now abandoned which prior application is incorporated herein by reference.

BACKGROUND OF THE INVENTION

1. Field of the Invention

The present invention relates to interface circuits for supplying a voltage from a control circuit referenced to a first voltage to a terminal not referenced to this voltage. The present invention will more specifically be described in the case where said terminal is a control terminal, but is not limited to this application.

2. Discussion of the Related Art

Interface circuits or voltage shifting circuits are used especially when a switch comprising two switches in parallel, head-to-tail, connected to a circuit supplied by an A.C. voltage is desired to be controlled. Generally, the control terminal of one of the two switches is referenced to a reference voltage and the control terminal of the other switch is referenced to a terminal which follows the variations of the A.C. voltage. To solve this problem, isolation circuits, for example, transformer or optocoupler circuits, are often used. Various interface circuits ensuring an isolation between the control terminal likely to be at a variable voltage and the control circuit are also known. However, a frequent disadvantage of such circuits is that they are not integrable, especially when the voltage on the control terminal which is desired to be driven can be high, for example, on the order of the voltages available on commercial supply networks (for example, 220 volts RMS).

FIG. 1 shows an example of a known interface circuit. A power circuit comprises an A.C. voltage source $V_{AC}$ supplying a load L in series with a bidirectional switch formed of two parallel voltage-controlled switches monodirectional for the current, MBS1 and MBS2, each of these switches being able to stand a high forward or reverse voltage. These switches are, for example, insulated-gate bipolar transistors (IGBT), manufactured in a well technology. It is assumed that the terminal of switch MBS1-MBS2 opposite to the load is connected to a reference voltage G. In the considered example, each of transistors MBS1 and MBS2 is controllable by a positive voltage applied between its gate and its emitter. Switch MBS2 has its emitter connected to reference terminal G. Thus, a control signal provided by a control circuit referenced to terminal G may be applied on its gate g2 with no specific precaution. However, switch MBS1 has its emitter connected on the side of variable A.C. voltage $V_{AC}$. The control order must be applied when the A.C. voltage is negative with respect to terminal G but, due to the presence of a gate-emitter resistance $R_{GE}$ and of a protection diode Z, gate g1 of transistor MBS1 is periodically at a high positive voltage from which the control circuit must be protected.

An example of a control circuit comprises a control block 10 and an interface circuit 20. Control block 10, for example, comprises a resistor R1 in series with an N-channel MOS transistor NMOS, between a supply voltage $V_{cc}$, for example, on the order of 10 volts, and reference ground G. The gate of transistor NMOS is connected to a terminal 11 which receives a control order, for example, the output of a microprocessor, and turns it, at the connection point between resistor R1 and transistor NMOS, into a signal CTRL likely to control interface circuit 20. The interface circuit comprises, between a terminal at voltage $V_{cc}$ and gate g1 of insulated-gate transistor MBS1, the series connection of a P-channel MOS transistor PMOS, of a resistor R2, and of a diode D1. Diode D1 is necessary to avoid that, when terminal g1 is at a high positive voltage, this positive voltage is sent to the control circuit connected to terminal 11 and to supply voltage source $V_{cc}$, which could be destructive for these elements. Indeed, transistors PMOS and NMOS in conventional configurations are not capable of blocking a reverse voltage.

It should be noted that the circuit of FIG. 1 only is an example of a control and interface circuit of prior art and that many other circuits may be provided to ensure similar functions. Bipolar transistor circuits could, for example, be envisaged instead of MOS transistor circuits. A feature common to this type of circuits is that they comprise in series a MOS or bipolar transistor likely to stand a forward voltage and a diode D1 likely to stand a reverse voltage of several hundreds of volts. In practice, there is no known manner of monolithically integrating such circuits, which are generally formed as discrete components, especially as concerns diode D1.

SUMMARY OF THE INVENTION

Thus, an object of the present invention is to provide an interface circuit between a control block and a high-voltage switch, the control terminal of which is not referenced to the control block reference voltage, the interface circuit being formable in monolithic form.

To achieve this and other objects, the present invention provides a monolithic interface circuit for providing a voltage, from a control circuit supplied by a supply voltage referenced to a reference voltage, to a terminal likely to be at a high voltage with respect to the reference voltage, comprising a high-voltage N-channel MOS transistor having its gate intended to receive a control signal referenced to the reference voltage and having its source intended to be connected to the reference voltage, and a high-voltage PNP transistor having its base connected to the drain of the MOS transistor, having its emitter intended to receive the supply voltage, and having its collector intended to provide a voltage to the terminal likely to be at a high voltage.

According to an embodiment of the present invention, said terminal is a control terminal of a switch.

According to an embodiment of the present invention, the high-voltage MOS transistor and the high-voltage PNP transistor are vertical transistors formed in an N-type silicon substrate surrounded with a P-type insulating wall, comprising, on its upper surface side, a first P-type region and a P-type well having its lateral portions formed of lightly-doped P-type regions, this well containing N-type source regions extending into the lightly-doped P-type areas, the upper surface of the lightly-doped P-type areas being coated with an insulated gate, and, on its lower surface side, a second P-type region facing the first P-type region and in contact with the insulating wall, the rear surface portion in which the substrate is apparent being coated with an insulating layer.

According to an embodiment of the present invention, the high-voltage PNP transistor is arranged around the high-voltage MOS transistor.

The foregoing objects, features, and advantages of the present invention will be discussed in detail in the following non-limiting description of specific embodiments in connection with the accompanying drawings.

DETAILED DESCRIPTION

Figure 1:
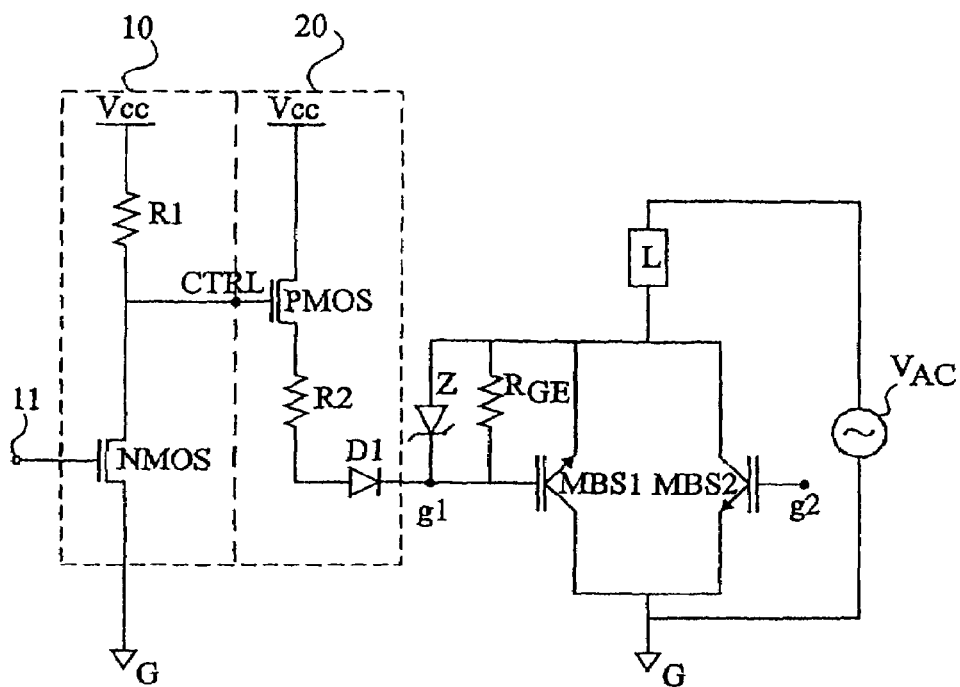
FIG. 1 shows an example of a known bidirectional switch control and interface circuit.
Figure 2:
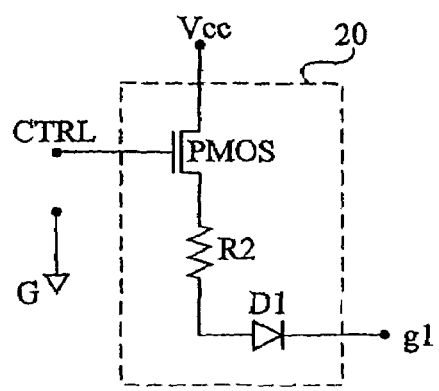
FIG. 2 shows a portion of the circuit of FIG. 1.

FIG. 2 is a partial cross-section view of the circuit of FIG. 1 which only illustrates interface circuit 20 and its connection terminals. A control terminal CTRL provides a control signal referenced to a reference voltage G. A supply terminal $V_{cc}$ may be connected to a terminal g1 when this terminal is more negative than $V_{cc}$ and a control signal is desired to be provided to a circuit to be controlled. It is further desired that, when terminal g1 is positive, there is no voltage return to terminal $V_{cc}$ or terminal CTRL to avoid degrading the supply circuit or the control block.

As indicated previously, the interface circuit illustrated in block 20 of FIG. 2 and described in relation with FIG. 1 is not integrable by known means when the voltage on terminal g1 is likely to be a high voltage that can reach values of several hundreds of volts.

Figure 3:
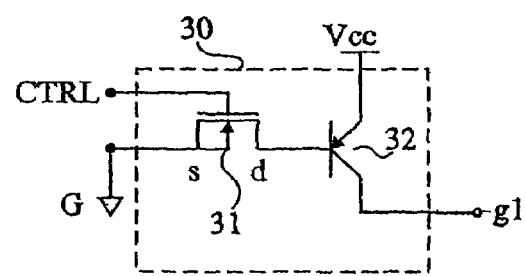
FIG. 3 shows an interface circuit according to the present invention.

As illustrated in FIG. 3, the present invention provides an interface circuit 30 connectable to the same terminals CTRL, G, $V_{cc}$, and g1 as the circuit of FIG. 2 and comprising an N-channel MOS transistor 31 and a PNP transistor 32, these two components being capable of standing high reverse voltages. According to the expression generally used in the art, it can be said that MOS transistor 31 and bipolar transistor 32 are high-voltage transistors. MOS transistor 31 has its source connected to reference voltage G and its gate receives control signal CTRL. The drain of MOS transistor 31 is connected to the base of PNP transistor 32 having its emitter connected to supply voltage $V_{cc}$ and its collector connected to terminal g1, to be controlled, likely to be at a high positive voltage. When terminal g1 is at a high positive voltage, high-voltage bipolar transistor 32 protects supply circuit $V_{cc}$ and high-voltage MOS transistor 31 protects the circuit for providing control signal CTRL.

Figure 4A:
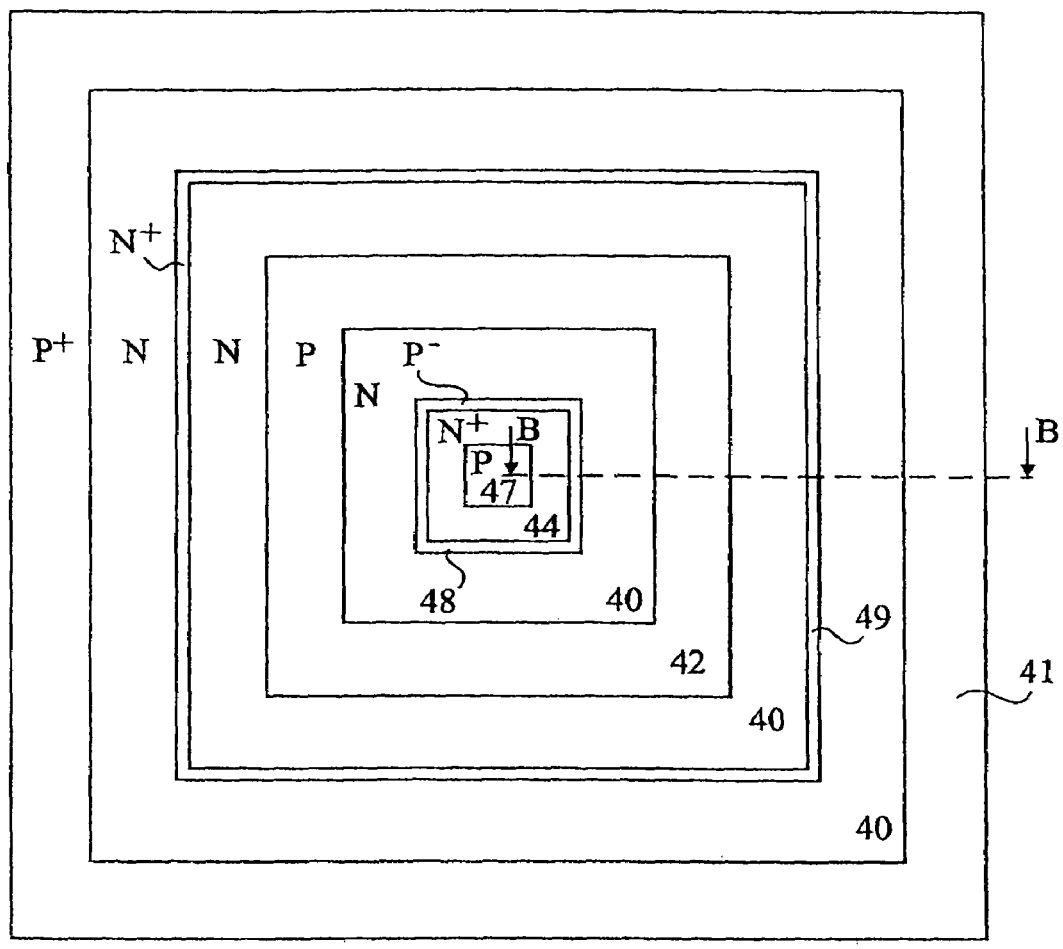
FIG. 4A shows a top view of an interface component according to the present invention.
Figure 4B:
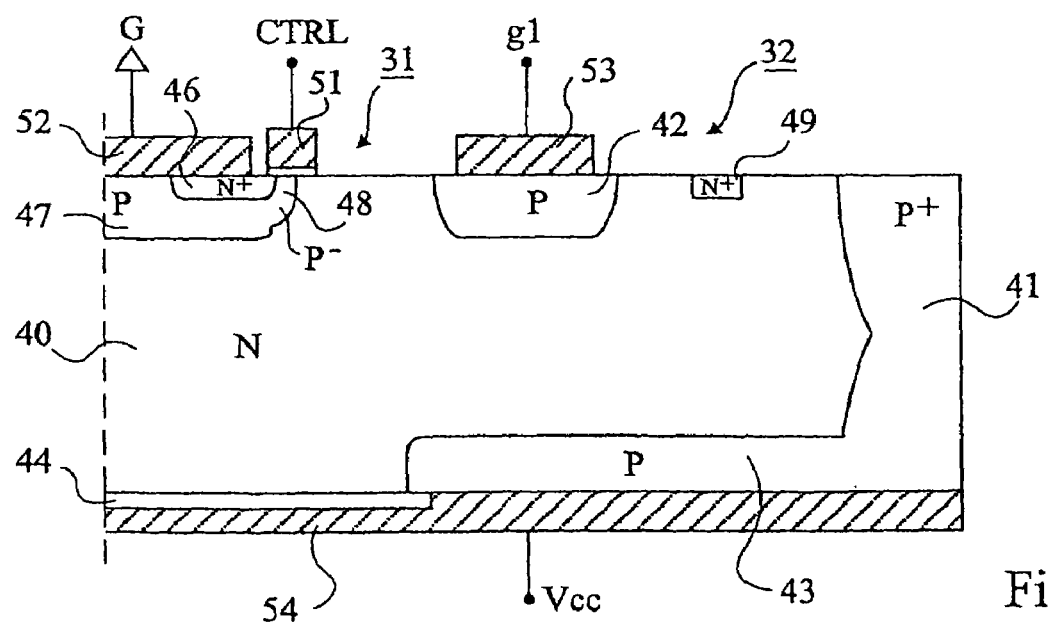
FIG. 4B shows a partial cross-section view along line B-B of the component of FIG. 4A.

It will be shown in relation with FIGS. 4A and 4B that an advantage of the circuit of FIG. 3 is that it can be relatively simply made in the form of a high-voltage monolithic circuit.

FIG. 4A shows a top view of the component and FIG. 4B shows a partial cross-section view of this component along line B-B of FIG. 4A. In the top view of FIG. 4A, the metallizations formed on the upper surface of the component are not shown. Further, for simplification, no insulation layers formed on the upper surface of the component between the various metallizations are shown either in FIG. 4A, or in FIG. 4B.

The component according to the present invention is formed in a lightly-doped N-type semiconductor wafer 40 and is surrounded with a heavily-doped P-type insulating wall 41. Preferably, although this is not shown, and conventionally, the upper surface of insulating wall 41 is coated with a metallization. PNP transistor 32 is made in vertical form and comprises, on the upper surface side of substrate 40, a P-type collector region 42 and, on the lower surface side, a P-type emitter region 43 in contact with insulating wall 41. As shown by the top view of FIG. 4A, P-type region 42 preferably has in top view a ring, square, or rectangle shape. Lower P-type region 43 preferably slightly extends inwards beyond the projection of region 42. The lower surface portion of the substrate not taken up by P-type region 43 is covered with an insulating layer 44, for example, silicon oxide.

N-channel MOS transistor 31 is also made in the form of a vertical MOS transistor comprising an N-type region 46 made in a P-type well 47, a more lightly-doped P-type region 48 extending towards the inside of well 47 to form the frontier between source region 46 and N-type substrate 40. As illustrated in the top view of FIG. 4A, this source region is for example arranged substantially at the center of the component. Region 48 is topped with a metallization 51 formed above a thin insulating layer. Source region 46-47 is topped with a metallization 52. P-type collector region 42 is topped with a collector metallization 53. The rear surface of the component is coated with a metallization 54 in contact with P-type region 43 and insulated from the substrate by insulating layer 44.

Using the notations of FIG. 3, collector metallization 52 is intended to be connected to reference voltage terminal G, gate metallization 51 is intended to be connected to the terminal receiving control signal CTRL, collector metallization 53 is intended to be connected to terminal g1 to be controlled, and rear surface emitter metallization 54 is intended to be connected to voltage $V_{cc}$.

Thus, when no current is applied on control terminal CTRL, the device can stand a high positive or negative voltage on terminal g1, the distance between P-type collector region 42 and the channel region of MOS transistor 48 being of course sufficient to ensure the voltage hold. A conventional channel stop region 49, possibly coated with a metallization as known in the field of power component periphery, has further been shown in FIGS. 4A and 4B.

When a positive voltage is applied on control terminal CTRL while terminal g1 is negative with respect to terminal G, the MOS transistor having region 46 as a source, region 48 as a channel, and substrate 40 as a drain, turns on and a current flows from rear surface metallization 54, through the forward junction between P region 43 and substrate 40, to ground terminal G. This current corresponds to a base current for PNP transistor 42-40-43 and this transistor turns on, whereby voltage $V_{cc}$ is applied on terminal g1. Thus, in the example of FIG. 1, this turns on insulated-gate transistor MBS1. Of course, the control circuit will be designed and possibly programmed so that no control signal is applied on terminal 11 (see FIG. 1) when voltage $V_{AC}$ is positive with respect to reference terminal G.

Although the present invention has been discussed in the context of a specific application, it should be understood that it generally applies to the forming of a level shifter or interface circuit between a control circuit and a circuit to be controlled, the control terminal of which can be at a high voltage.

Figure 5:
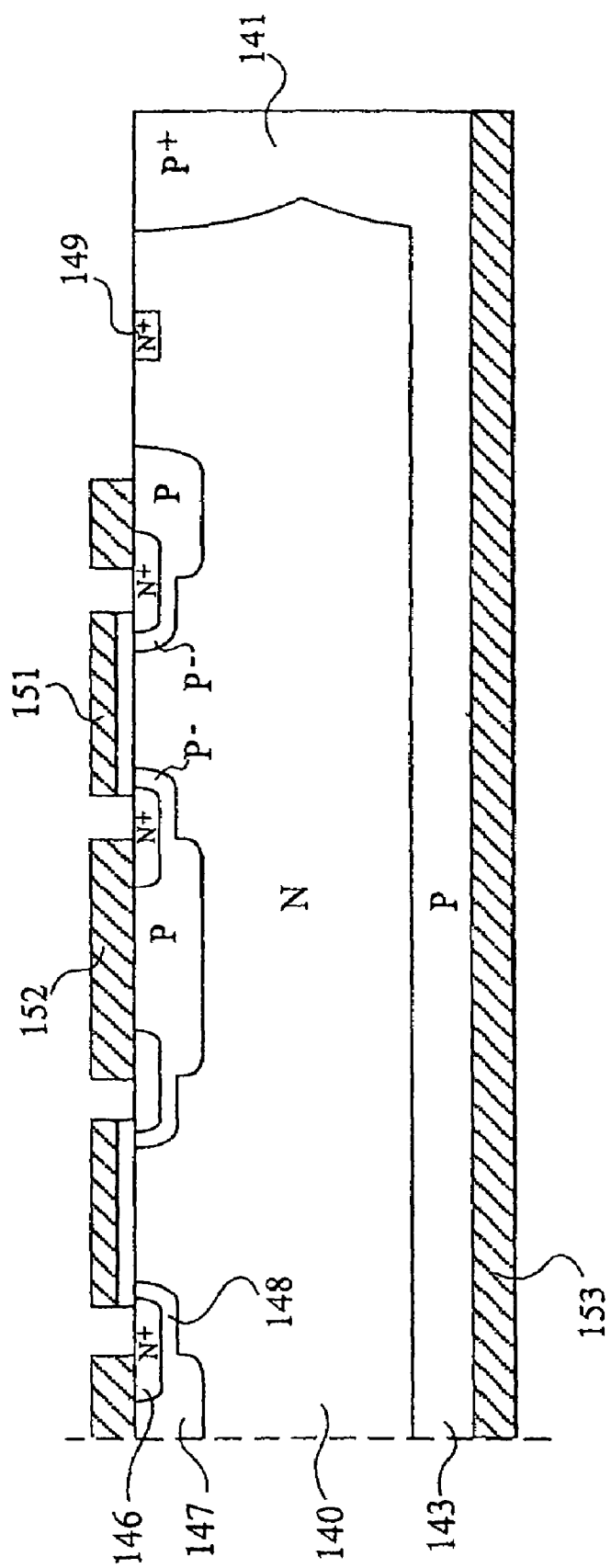
FIG. 5 shows a cross-section view of an example of the structure of an insulated-gate bipolar transistor with a well according to the state of the art.

An advantage of the device of the present invention is that it is particularly easy to form from the known state of the art. Indeed, as illustrated in FIG. 5, there exists a strong structural analogy between a component according to the present invention and an insulated-gate bipolar transistor with a well. Such an insulated-gate bipolar transistor with a well is for example described in U.S. Pat. No. 6,580,100, issued Jun. 17, 2003, which is incorporated herein by reference.

Thus, as illustrated in FIG. 5, and using for this drawing, when necessary, same references as in FIG. 4 preceded with number 1, an insulated-gate bipolar transistor with a well comprises an N-type substrate 140, a heavily-doped P-type peripheral insulating wall 141, a continuous rear surface P-type layer 143, and heavily-doped N-type source regions 146 formed in P-type wells 147, the peripheries of these wells being formed of lightly-doped P-type regions 148. A heavily-doped channel stop N-type region 149 is formed at the periphery of the component between the insulating wall and the limit of the last P-type well of the transistor. The gates of the insulated-gate bipolar transistor are coated with an insulated metallization 151, the sources are coated with a metallization 152, and the rear surface is coated with a metallization 153. As known, when the gate is biased while the source metallization is negative with respect to rear surface metallization 153, a current flows from metallization 153 to metallization 152, through the channel regions formed under the gates and through N-type regions 146. However, when a reverse voltage is applied to the component, that is, a negative voltage is applied on the drain and a positive voltage is applied on the source, the PN junction between regions 143 and 140 ensures an excellent voltage hold especially due to the fact that region 143 is surrounded with well 141.

It should be noted, by comparing FIGS. 5 and 4B, that the component according to the present invention is as concerns its structure very similar to the insulated-gate bipolar transistor of FIG. 5, except for two differences. A first difference is that rear surface P layer forming the emitter of the PNP transistor of the component according to the present invention is interrupted and that the rest of the rear surface is coated with an insulating layer 44. A second difference is that collector 42 of the bipolar transistor corresponds to a P well 147 of the transistor of FIG. 5 in which no N-type source region has been formed. An advantage that those skilled in the art could draw from this similarity is that all the performed calculations and all the performed optimizations (especially to ensure the voltage hold, the immunity against unwanted triggerings . . . ) for the component of FIG. 5 apply with the necessary changes having been made to the component according to the present invention.

It has been previously considered that terminal g1 likely to be at a high voltage with respect to terminal CTRL was a control terminal of a switch and that the interface circuit according to the present invention was a control voltage provision circuit. It should be noted that the interface circuit according to the present invention is not limited to this application and that generally, it enables providing an isolation between a first voltage (CTRL) referenced to a first potential (G) and a circuit referenced to a second voltage (g1). Referring to FIG. 3, it can thus be envisaged that voltage $V_{cc}$ supplies a load arranged between transistor 32 and ground g1.

Of course, the present invention is likely to have various alterations, modifications, and improvement which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A monolithic interface circuit for providing a voltage, from a control circuit supplied by a supply voltage referenced to a reference voltage, to a terminal likely to be at a high voltage with respect to the supply and reference voltages, wherein the high voltage is higher than the supply voltage, the interface circuit comprising:
    a high-voltage N-channel MOS transistor having its gate intended to receive a control signal referenced to the reference voltage and having its source intended to be connected to the reference voltage, and
    a high-voltage PNP transistor having its base connected to the drain of the MOS transistor, having its emitter intended to receive the supply voltage, and having its collector intended to provide a voltage to the terminal, wherein when the terminal is at the high voltage, the high voltage PNP transistor protects the supply voltage from receiving the high voltage and the high voltage N-channel MOS transistor protects the control circuit from receiving the high voltage;
    wherein the high-voltage N-channel MOS transistor and the high-voltage PNP transistor are formed in a semiconductor substrate;
    wherein the high-voltage PNP transistor surrounds the high-voltage N-channel MOS transistor.

2. The monolithic interface circuit of claim 1, wherein said terminal is a control terminal of a switch.

3. A method of providing a monolithic interface circuit for providing a voltage, from a control circuit supplied by a supply voltage referenced to a reference voltage, to a terminal likely to be at a high voltage with respect to the supply and reference voltages, wherein the high voltage is higher than the supply voltage, the method comprising:
    using a high-voltage N-channel transistor formed in a substrate having its gate intended to receive a control signal referenced to the reference voltage and having its source intended to be connected to the reference voltage, wherein the high-voltage N-channel transistor protects the control circuit from receiving the high voltage; and
    using a high-voltage PNP transistor formed in the substrate and surrounding the high-voltage N-channel transistor, the high-voltage PNP transistor having its base connected to the drain of the high voltage N-channel transistor, having its emitter intended to receive the supply voltage, and having its collector intended to provide a voltage to the terminal, wherein the high-voltage PNP transistor protects the supply voltage from receiving the high voltage.

4. The method of claim 3, wherein said terminal is a control terminal of a switch.

5. An interface circuit, comprising:
    a MOS transistor having a control terminal to receive a first signal;
    a bipolar transistor coupled to the MOS transistor, the bipolar transistor providing a supply voltage to an output terminal of the bipolar transistor in response to receiving a second signal from the MOS transistor, wherein the supply voltage is less than or equal to about ten volts;
    wherein, when the bipolar transistor is not providing the supply voltage to the output terminal, the control terminal of the MOS transistor is protected from a voltage higher than the supply voltage received at the output terminal of the bipolar transistor;
    wherein the bipolar transistor comprises a collector region farmed on a first side of a semiconductor substrate, a base region formed in an intermediate portion of the semiconductor substrate, and an emitter region formed on a second side of the semiconductor substrate;
    wherein the MOS transistor comprises a channel region contacting the base region of the bipolar transistor.

6. The interface circuit of claim 5, wherein the MOS transistor is coupled to a reference voltage, wherein the MOS transistor provides the reference voltage to a base of the bipolar transistor when the MOS transistor is turned on.

7. The interface circuit of claim 6, wherein the bipolar transistor is a PNP transistor having an emitter coupled to the supply voltage and a collector coupled to the output terminal.

8. The interface circuit of claim 7, wherein the MOS transistor is an N-channel MOS transistor having a source coupled to the reference voltage and a drain coupled to the base of the bipolar transistor.

9. The interface circuit of claim 5, wherein the bipolar transistor substantially surrounds the MOS transistor.

10. A monolithic interface circuit for providing a voltage, from a control circuit supplied by a supply voltage referenced to a reference voltage, to a terminal likely to be at a high voltage with respect to the supply and reference voltages, wherein the high voltage is higher than the supply voltage, the interface circuit comprising:
- a high-voltage N-channel MOS transistor having its gate intended to receive a control signal referenced to the reference voltage and having its source intended to be connected to the reference voltage, and
- a high-voltage PNP transistor having its base connected to the drain of the MOS transistor, having its emitter intended to receive the supply voltage, and having its collector intended to provide a voltage to the terminal, wherein when the terminal is at the high voltage, the high voltage PNP transistor protects the supply voltage from receiving the high voltage and the high voltage N-channel MOS transistor protects the control circuit from receiving the high voltage, wherein the high-voltage N-channel MOS transistor and the high-voltage PNP transistor are vertical transistors formed in an N-type silicon substrate surrounded with a P-type insulating wall, comprising:
- on its upper surface side, a first P-type region and a P-type well having its lateral portions formed of lightly-doped P-type regions, this well containing N-type source regions extending into the lightly-doped P-type areas, the upper surface of the lightly-doped P-type areas being coated with an insulated gate, and
- on its lower surface side, a second P-type region facing the first P-type region and in contact with the insulating wall, the rear surface portion in which the substrate is apparent being coated with an insulating layer.

11. The monolithic interface circuit of claim 10, wherein the high-voltage PNP transistor is arranged around the high-voltage N-channel MOS transistor.

* * * * *